United States Patent [19]
Cooke et al.

[11] Patent Number: 4,540,903
[45] Date of Patent: Sep. 10, 1985

[54] SCANNABLE ASYNCHRONOUS/SYNCHRONOUS CMOS LATCH

[75] Inventors: Laurence H. Cooke; Robert A. Feretich; Richard F. Boyle, all of Santa Clara County, Calif.

[73] Assignee: Storage Technology Partners, Louisville, Colo.

[21] Appl. No.: 542,829

[22] Filed: Oct. 17, 1983

[51] Int. Cl.³ ............................................. G11C 11/28
[52] U.S. Cl. .............................. 307/465; 307/272 A; 307/276; 307/269; 307/481; 377/66; 377/78
[58] Field of Search ........... 307/480, 481, 269, 272 A, 307/276, 465; 328/201, 206; 377/19, 54, 64, 66, 78; 371/16

[56] References Cited

U.S. PATENT DOCUMENTS

| | | | |
|---|---|---|---|
| 3,764,920 | 10/1973 | Galcik et al. | 307/480 X |
| 3,812,388 | 5/1974 | Southworth | 307/481 X |
| 3,838,345 | 9/1974 | Schneider | 377/66 |
| 4,293,780 | 10/1981 | Roesler | 307/480 X |
| 4,334,157 | 6/1982 | Ferris | 307/480 X |
| 4,403,287 | 9/1983 | Blahut et al. | 371/16 X |

OTHER PUBLICATIONS

Brunsvold, "Queue Storage Register", IBM Tech. Disc. Bull., vol. 13, No. 12, May 1971, pp. 3743-3744.

*Primary Examiner*—Stanley D. Miller
*Assistant Examiner*—D. R. Hudspeth
*Attorney, Agent, or Firm*—Bryant R. Gold; James R. Young

[57] ABSTRACT

A scannable asynchronous/synchronous CMOS latch circuit that includes a first, second, and third latch element, an asynchronous latch section, and a clock control section. When operated as a synchronous latch, the first latch element operates as the "master" portion and the second latch element acts as the "slave" portion of a master/slave latch. The clock control circuit enables the clock signals to control the synchronous operation of the master/slave latch. When operated as an asynchronous latch, the clock control circuit disables the clock. The output of the asynchronous latch section is connected to the input of the first latch element. An asynchronous signal appearing on one of the inputs of the asynchronous latch section passes through the first and second latch elements and is applied to another input of the asynchronous latch section, causing it to be latched, or held. Separate outputs are provided for the asynchronous latch and the synchronous latch. When scanning occurs, the second and third latch elements act as a shift register stage. The second latch element acts as the master while the third latch element acts and the slave of a master/slave latch. The contents of the asynchronous latch can be latched in the slave section of the synchronous latch for scanning. Shift-in data is coupled to the master, then transferred to the slave, where it appears on the shift-out output, by appropriate clock signals.

13 Claims, 5 Drawing Figures

SCANNABLE ASYNCHRONOUS/SYNCHRONOUS CMOS LATCH

BACKGROUND OF THE INVENTION

This invention relates to large scale integration (LSI) and very large scale integration (VLSI) circuit chips that use complementary metal oxide semiconductor (CMOS) technology. More particularly, the invention relates to a CMOS circuit that can selectively function as either a synchronous latch, an asynchronous latch, or a stage of a shift register, using the same clock signals as used by the synchronous latch circuit.

A synchronous latch circuit requires a clock signal to cause it to operate. When the clocking signal occurs, the logic level, or data, that was on an input of the latch immediately prior to the clock signal is stored in the latch. An asynchronous latch circuit on the other hand, does not use a clock signal. It typically has three inputs; a signal input, a reset input, and a feedback input (which feedback input is connected to the output). When an asynchronous latch is reset, it will set (the output changes state) whenever the signal input changes to the correct logic level. Moreover, it will remain set, because of the feedback signal, regardless of subsequent changes in the signal input. The asynchronous latch circuit is reset by momentarily changing the reset signal.

A central processing unit (CPU) of a modern large computer system basically includes synchronous latch circuits, combinatorial logic circuits, i.e., logic circuits that do not store data, and a clocking system. The inputs to the latch circuits come from the outputs of combinatorial logic circuits while the outputs of the latches go to the inputs of other combinatorial logic circuits. At the end of a clock cycle, which is also the beginning of the next clock cycle, the data on the outputs of the combinatorial logic circuits is stored in the synchronous latch circuits to which they are connected. This data appears on the outputs of the synchronous latch circuits and is applied to the inputs of other combinatorial logic circuits, which logic circuits then perform the desired logic function on the data. At the end of the clock cycle, the outputs of all the combinatorial logic circuits are again stored in synchronous latch circuits. This process is repeated over and over as the computer system operates; that is, data is processed by the combinatorial logic circuits, stored in synchronous latch circuits, and each set of combinatorial logic circuits receives a new set of data for processing from the data just stored in the synchronous latch circuits.

As described above, the operation of a large computer is synchronous. However, the peripheral devices connected to the computer, such as magnetic disk storage systems, terminals, communication devices, etc., do not use the clocking system of the CPU to operate, and hence operate asynchronously with respect to the CPU. Also, signals from a peripheral device can occur at any time and can be shorter in duration than the clock cycle of the CPU. If such a signal were applied to the input of a synchronous latch in the CPU, it might be gone when the clock signal occurs and therefore not be latched. Hence, signals from peripheral devices are typically applied to the input of an asynchronous latch. Once latched in the asynchronous latch, the signal from the peripheral equipment can be processed in a synchronous manner by the CPU.

While the use of an asynchronous latch circuit in a synchronous computer provides the advantage of "capturing" asynchronous signals, it has the disadvantage, as explained below, of not being testable in the same manner as the synchronous latch circuits. One circuit common in large computer systems is a "scannable" synchronous latch. Such a latch circuit can be converted to a stage of a shift register by use of appropriate clock and control signals. The contents of the synchronous latch circuit can be "scanned" by using the resulting shift register stage to shift out the contents for examination. The shift register stage, and therefore the synchronous latch circuit, can also be loaded with the desired contents by shifting new data thereinto. (Hereafter, a "latch circuit" may simply be referred to as a "latch".)

When all of the synchronous latches of a CPU are of the scannable type as described above, selected sets can be interconnected to form shift registers. Appropriate timing signals can then be used to stop the operation of the CPU at any time, convert the synchronous latches into stages of a shift register, and scan the contents of the latches, e.g., shift the contents of the resulting shift register to an operator's console for examination. Any, or all, of the resulting shift registers can be thus examined. Also, while the operation of the CPU is stopped, a known set of data can be shifted into any or all of the sets of latches via the shift registers. With this known set of data loaded into the CPU, the CPU can then be allowed to function for some known number of cycles and then stopped again. The appropriate latches can then be scanned to see if they contain the correct results.

As thus described, the scannable synchronous latch provides a powerful feature for testing a large computer. Using the techniques highlighted above, all the synchronous latches and their associated combinatorial logic circuits can be fully tested.

Disadvantageously, asynchronous latch circuits of the prior art cannot be converted to a shift register stage, and therefore cannot be tested in the manner described above. This is not to say that such asynchronous latch circuits cannot be tested. As an individual packaged chip, it is usually possible to fully test any asynchronous latch using a suitable chip tester. This is possible since the asynchronous latch is used to receive asynchronous signals from external sources through the input pins of the chip package. Since chip testers usually have the ability to control all the inputs to the chip, as well as to monitor all the outputs from the chip, the asynchronous latch can be set or reset, as desired, by the chip tester as the chip is individually tested.

However, once the chip becomes part of a larger system, such as a computer system, the inputs to the asynchronous latches are controlled by the overall system within which the chip is used (e.g., by the peripheral equipment connected to the computer system). Thus, inputs of the asynchronous latch can no longer be fully controlled, and the asynchronous latch can not be fully tested. Unfortunately, this means that other circuits on the chip cannot be tested as well. This is because the output of an asynchronous latch is typically applied to the input of one or more combinatorial logic circuits. Since these inputs can not be controlled, the combinatorial logic circuits can not be fully tested.

This particular problem of lack of testability in the system environment is particularly acute when the system includes LSI and VLSI circuit chips where a very large number of circuits are included on the same chip.

Particularly in the field of CMOS technology, where circuit densities on a chip and overall system compactness have the potential for dramatic increases over what has heretofore been achievable, it is extremely critical that a suitable chip be developed that can be tested both individually and within the system.

It can thus be seen that a need exists in the art, especially in the CMOS technology art, for a scannable asynchronous latch circuit. So as not to unduly complicate the operation of such a scannable asynchronous latch, it would be advantageous for such a circuit to be controlled during system test by the same clock signals that control the synchronous latches on the same chip.

SUMMARY OF THE INVENTION

An object of the present invention is to provide a scannable asychronous latch circuit that can be selectively converted through the application of appropriate control and clocking signals to a scannable synchronous latch circuit. A further object of the invention is to provide such a circuit that does not require the generation of special clock signals to enable scanning or to cause the circuit to operate as a synchronous latch, but to provide a circuit wherein the same clock signals used to control the operation and scanning of the other synchronous latch circuits in the system can also be used to convert the asynchronous latch circuit to a synchronous one and to control the operation and the scanning thereof.

The scannable asynchronous latch circuit of the present invention includes an asynchronous latch circuit, a scannable synchronous latch circuit and clock control circuitry. The asynchronous latch circuit has an output and three inputs: a signal input, a reset input, and a feedback input. The output of the asynchronous latch circuit is connected to both the circuits of the system which use its output and to an input of the scannable synchronous latch circuit. The output of the scannable synchronous latch is connected to the feedback input of the asynchronous latch circuit.

When the circuit of the present invention is to be used as an asynchronous latch, the clock control circuitry prevents the clock signal from affecting the synchronous latch. In this asynchronous latch mode, the outputs of the clock control circuitry cause the synchronous latch to be in a state such that a direct signal path exists between its input and output. Thus, the feedback input of the asynchronous latch is electrically connected to the output of the asynchronous latch, as in a conventional asynchronous latch circuit, and the asynchronous latch will set whenever the signal input changes to the correct level.

In a preferred embodiment, the scannable synchronous latch circuit that is used as part of the present invention includes three latch segments. The first and second segments form the master and slave sections, respectively, of a synchronous latch. The second and third segments form the master and slave sections, respectively, of a shift register stage. Advantageously, the same clock signals used to control the operation of the other scannable latch circuits of the system may be used to control the operation of the scannable synchronous latch circuit included as part of the present invention.

In a synchronous latch mode of operation the clock control circuitry allows the normal clock signals to be applied to the synchronous latch. Because an output of the asynchronous latch circuit is connected to an input of the synchronous latch circuit, the operation of the asynchronous latch can therefore be synchronized, for example, during test, by latching its output into the slave section of the synchronous latch with the proper clock signals.

The synchronous latch circuit used as part of the present invention is scanned through the use of two additional clock signals. The content of the synchronous latch, held in the second section (the slave of the latch and the master of the shift register), is transferred to the third section (the slave section of the shift register), where it appears as a shift out signal for the state. The asynchronous latch circuit of the invention may therefore be scanned by first converting the circuit to a synchronous latch by enabling the synchronous latch made of operation. When this happens, the output of the asynchronous latch is latched directly into the slave section of the synchronous latch. Since this is the master section of the shift register stage, the contents can then be scanned in the same manner as is used with any synchronous latch.

BRIEF DESCRIPTION OF THE DRAWINGS

The above and other objects, features, and advantages of the present invention will be more apparent from the following description of the preferred embodiment, given in conjunction with the following drawings, wherein:

FIG. 3a is a logic drawing of the scannable asynchronous/synchronous latch circuit of the present invention;

FIG. 3b is a truth table for the clock control circuit of FIG. 3a; and

DESCRIPTION OF THE PREFERRED EMBODIMENT

The following is a description of the best presently contemplated mode of carrying out the present invention. This description is given only for the purpose of describing the general principles of the invention and is not to be taken in a limiting sense. To ascertain the true scope of the invention, reference should be made to the appended claims.

Figure 1:
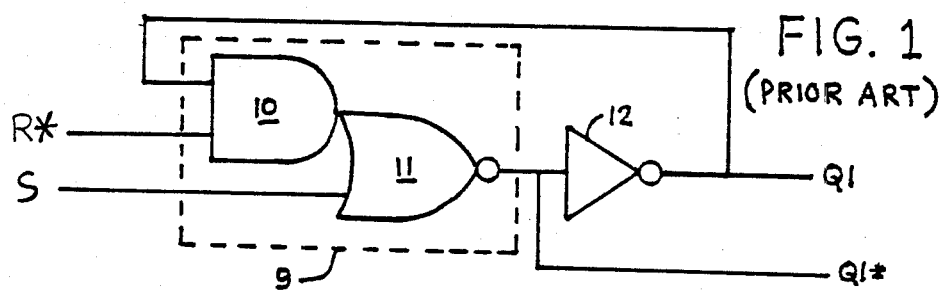
FIG. 1 is a logic drawing of a typical asynchronous latch circuit of the prior art.

FIG. 1 is a logic drawing of a typical asynchronous latch circuit of the prior art. The operation of this prior art circuit will be described in order that the objects, features, and advantages of the present invention may be better understood. The circuit consists of an AND-OR-INVERT (AOI) gate 9, comprising an AND gate 10 providing one input to an NOR gate 11; and an inverter gate 12 connected the output of the NOR gate 11. In this figure, and in subsequent figures used in this description of the preferred embodiment, an asterisk (*) is used with some signal names. The asterisk is used to denote a signal that is true when at a low logic level. A signal name with an asterisk is the logical complement of the same signal without the asterisk. Thus, the signal R is true when at a high level while its complement, R*, is simultaneously low and also true. (The use of an asterisk is equivalent to the use of a bar over the signal name or a minus sign in front of the signal name, all three of which methods of nomenclature are found in the art.)

The circuit of FIG. 1 has three inputs, S (Set), R* (Reset), and a feedback signal which is connected to an output Q1. (Q is likewise a standard designator commonly used by those skilled in the art to designate the output of latches and flip-flops.) When the latch is set, the signal Q1 will be high and Q1* will be low.

The circuit of FIG. 1 functions as follows: When the latch is not set, that is when R* is high (the reset signal is false), S is low, Q1 is low and Q1* is high, the output of the AND gate 10 is low, since one of its inputs is low, and the output of the NOR gate 11 is high, since both of its inputs are low. (The terms "high" and "low" as used in this context refer to the level of the signal. The level of a particular signal at any given time may be used to indicate the status of a particular bit of digital data. That is, a low signal—such as an input or an output that is "low"—may be indicative of a logic bit "0", whereas a high signal may be indicative of a logic bit "1". Thus, by controlling the levels of signals applied to the inputs of the digital circuits, the levels of the output signals of the digital circuits will take on desired values. As explained previously, in the case of "latch" circuits, it is desirable that the output take on the same value as the input either synchronously with a clock signal, or asynchronously without reference to a clock signal. In this way, data bits may be controllably passed through or held within the latch circuit).

Referring again to FIG. 1, when the signal S goes high, the output of the NOR gate 11 goes low and the output of the inverter 12, which is also the Q output, goes high. The high level signal Q1 is fed back to an input of the AND gate 10. Since both of the inputs to the AND gate are now high, its output will also be high. If the signal S should go low, the high level output of the AND gate 10, through the NOR gate 11 and inverter 12, will maintain the Q1 output at a high level. That is, it will remain set regardless of changes in the signal S.

In order to set the latch, the signal S need only go high for the amount of time it takes the logic level changes to propagate through the NOR gate 11, the inverter 12, and the AND gate 10. When the signal S is low, the latch can be reset by making the reset complement signal R* low. The output of the AND gate 10 will then go low, the output of the NOR gate 11 will go high, and the output of the inverter 12 (Q1) will go low. (The latch circuit of FIG. 1 is sometimes referred to as a set dominated Set-Reset (SR) latch.)

Figure 2:
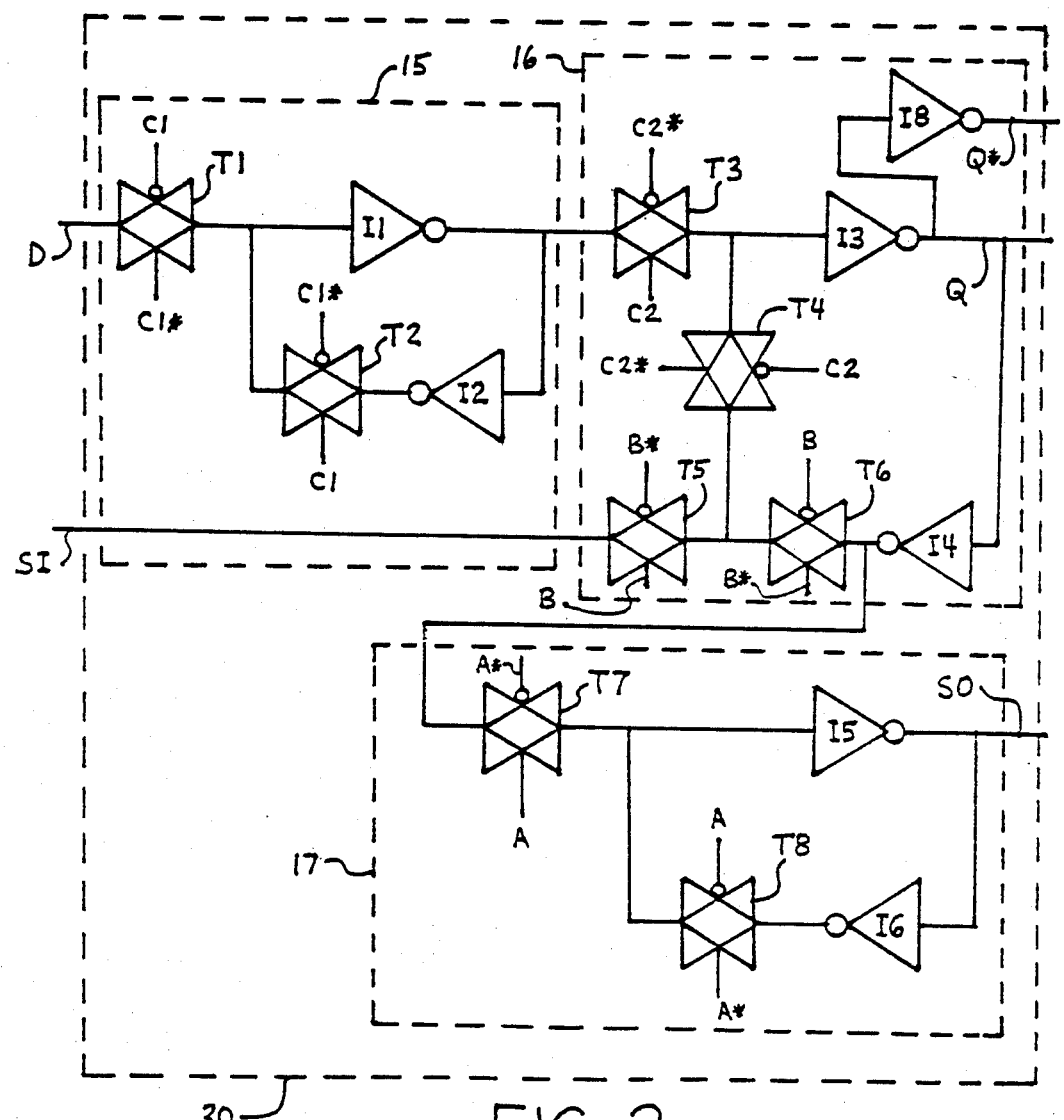
FIG. 2 is a logic drawing of a CMOS synchronous latch circuit.

FIG. 2 is a logic drawing of a CMOS scannable synchronous latch circuit. This circuit is fully described in copending patent application, "A CMOS SCANNABLE LATCH", Ser. No. 460,952, filed 01/25/83, U.S. Pat. No. 4,495,629 assigned to the same assignee as the present application. Patent application Ser. No. 460,952, is hereby incorporated in this application by reference, and will hereafter be referred to as the '952 patent application. FIG. 2 is identical to FIG. 3 of the referenced '952 application, with the exception that an inverter I8 has been added to FIG. 2, and FIG. 2 shows two clock signals C1 and C2, rather than a single clock signal C as is shown in the '952 application. (Note, that for purposes of comparing the '952 application to FIG. 2, that C=C1−C2.)

Since the circuit is fully described in the aforecited '952 application, its operation will be described only briefly here. The elements within the three dashed blocks 15, 16, and 17 each form a latch circuit. With the appropriate clock signals, the elements within block 15 form the master sections and the elements within block 16 form the slave section, of a synchronous latch circuit. By the application of other clock signals, blocks 16 and 17 form the master and slave sections, respectively, of a shift register stage.

When the circuit of FIG. 2 is used as a synchronous latch, the clock signals A and B are low and transmission gates T6 and T8 are turned on. (As a logic diagram convention, a transmission gate is turned on when the signal applied to the output shown with a circle is low. When it is turned on, logic level signals are passed through it. When it is turned off, logic level signals are blocked). In operation, the clock signal C1 and C2 can load the data appearing on the input signal line D into the master section 15 and transfer it to the slave section 16, where it appears on the outputs Q and Q*. This is done without affecting the shift register output SO. When used as a synchronous latch, the input signal to the shift register state, SI, is blocked by the transmission gate T5.

When the circuit of FIG. 2 is used as a shift register stage, C1 and C2 are held low. Transmission gates T1 and T4 are turned on and gates T2 and T3 are turned off. Transmission gate T3 blocks the latch input D, and the clock signals A and B control the shift register stage. The shift in signal SI is loaded into the master section 16 of the shift register by the clock signal B and transferred to the slave section 17 by the clock signal A.

In the figure, the shift out signal SO is always the opposite polarity of the shift in signal SI because of the triple inversion caused by inverters I3, I4 and I5 (a triple inversion is logically the same as a single inversion). Other embodiments exist wherein the signals SO and SI are always the same polarity. For example, referring to FIG 2, this could be accomplished by connecting SO to the output of inverter 16 rather than the input.

Figures 3A, 3B:
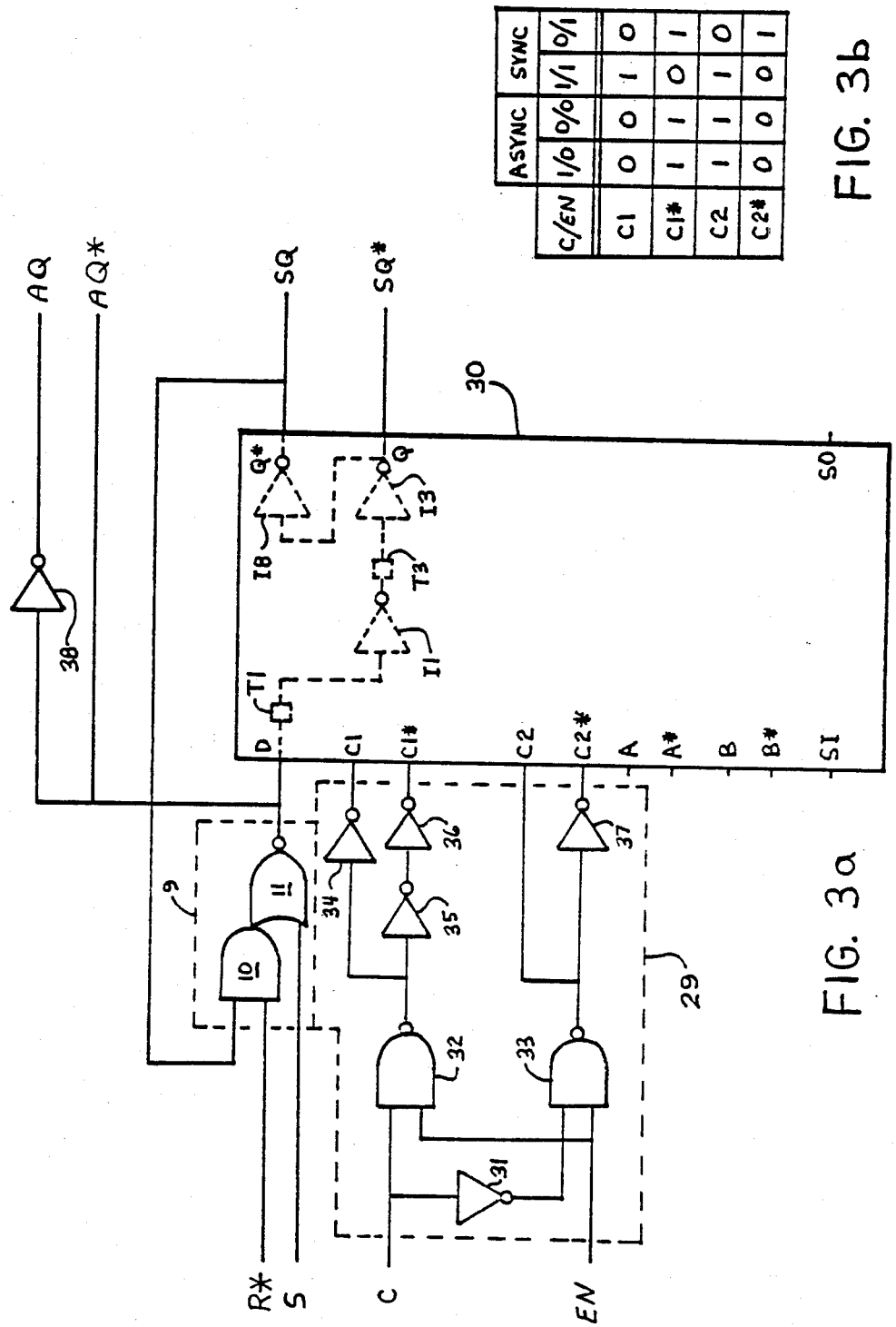

FIG. 3a is a logic drawing of the preferred embodiment of the scannable asynchronous/synchronous latch of the present invention. The circuit combines the circuits of FIGS. 1 and 2 with clock control circuitry 29. The entire circuit of FIG. 2 is represented in FIG. 3a by the block 30. The AOI gate 9 of FIG. 1 is shown while the inverter 12 of FIG. 1 is replaced, as explained below, by the inverter I8 of FIG. 2.

FIG. 3b is a truth table for the clock control circuitry 29. The table is divided vertically into the two types of operations possible: asynchronous (ASYNC) and synchronous (SYNC), as indicated by the top row. The second row shows the four possible values of the two inputs, C (clock) and EN (enable), to the clock control circuitry 29. The next four rows show the values of the outputs, C1, C1*, C2 and C2*, of the clock control circuitry 29 as a function of the values of C and EN.

When EN is low, C1=C2*=0 and C1*=C2=1 regardless of the value of C. When EN is high, C1=C2=C. As indicated previously, this is the condition for synchronous operation of the latch in the aforecited '952 patent application. The clock control circuitry 29 provides the correct clock signals C1 and C2 to the latch circuit 30 as to allow asynchronous or synchronous operation as determined by the enable signal EN.

In the circuit of FIG. 2, during synchronous operation, it is important that the clock signals C1 and C2 change simultaneously. Referring to FIG. 3a, this is realized by having the clock signal C be delayed by two circuits, 32 and 34, in generating signal C1, and by two circuits, 31 and 33, in generating signal C2. Also, clock signal C is delayed by three circuits, 32, 35 and 36, in generating the signal C1* and by three circuits 31, 33 and 37, in generating signal C2*.

The operation of the circuit of FIG. 3a will now be given with respect to FIGS. 2, 3a and 3b. When the circuit is operated as an asynchronous latch, the signal EN is held low, and the signals C1 and C2* are always low while signals C1* and C2 are always high. Under these conditions, transmission gates T1 and T3 are turned on and T2 and T4 are turned off. The output of the NOR gate 11 therefore passes through the inverters I1, I3 and I8 and is applied to one of the inputs of the AND gate 10. As long as the signal EN is low, the synchronous latch stages 15 and 16 are disabled, since T2 and T4 are turned off, and the stages 15 and 16 serve merely as an inverter for the asynchronous latch. The asynchronous latch therefore is equivalent to the one of FIG. 1 and functions as described in connection with the description of FIG. 1. Since the NOR gate 11 inverts the signal S, its output is labeled AQ* (asynchronous Q*) and an inverter gate 38 is used to produce the signal AQ.

When the signal EN is high, the clock signal C is the same as the clock signal C1, which is the same as the clock signal C2. As mentioned previously, this condition is necessary for the master section 15 and the slave section 16 to function as a synchronous latch. In this synchronous mode, the outputs of the latch 30 are labeled SQ (synchronous Q) and SQ* and have the same polarity as AQ and AQ*, respectively. Because the NOR gate 11 inverts the signal S before being applied to the D input of the synchronous latch 30, SQ and SQ* have the opposite polarity of Q and Q*, respectively.

When using the circuit of FIG. 3a as an asynchronous latch, its contents can be scanned by first converting the circuit to a synchronous latch by making the signal EN high. As explained previously, the clock signal C is held low while scanning occurs. When EN is high and C is low, C1 and C2 are also low. The transmission gate T3 is turned off and gate T4 is turned on. The inverted contents of the asynchronous latch (inverted by inverter gate I8, NOR gate 11, and inverter I1) are therefore latched into the master section 15 of the shift register stage. The clock signals A and B, as described in the previously cited '952 application, can be used to perform the scan.

When the reset signal R* is held low, the AND gate 10 is disabled, its output is low, and the output of the NOR gate 11 is controlled solely by the input signal S. Thus, the NOR gate 11 merely acts as an inverter to the input of the latch circuit 30. When the circuit 30 is used in the synchronous mode, it functions exactly as the synchronous latch of the aforecited '952 application, with the output signal SQ having the same polarity as the input signal S which was latched. When the circuit 30 is operated in the asynchronous mode, it functions as a passthrough latch, i.e., a latch that can be converted to a circuit whose output level follows the input signal. (Passthrough latches are typically used during testing to pass or block test signals.)

Advantageously, the clock signal C and reset signal R* are the same signals used by the remaining circuits of the system of the preferred embodiment. Thus, the objective of providing a scannable asynchronous/synchronous latch that does not require special clocking or control signals is realized.

Figure 4:
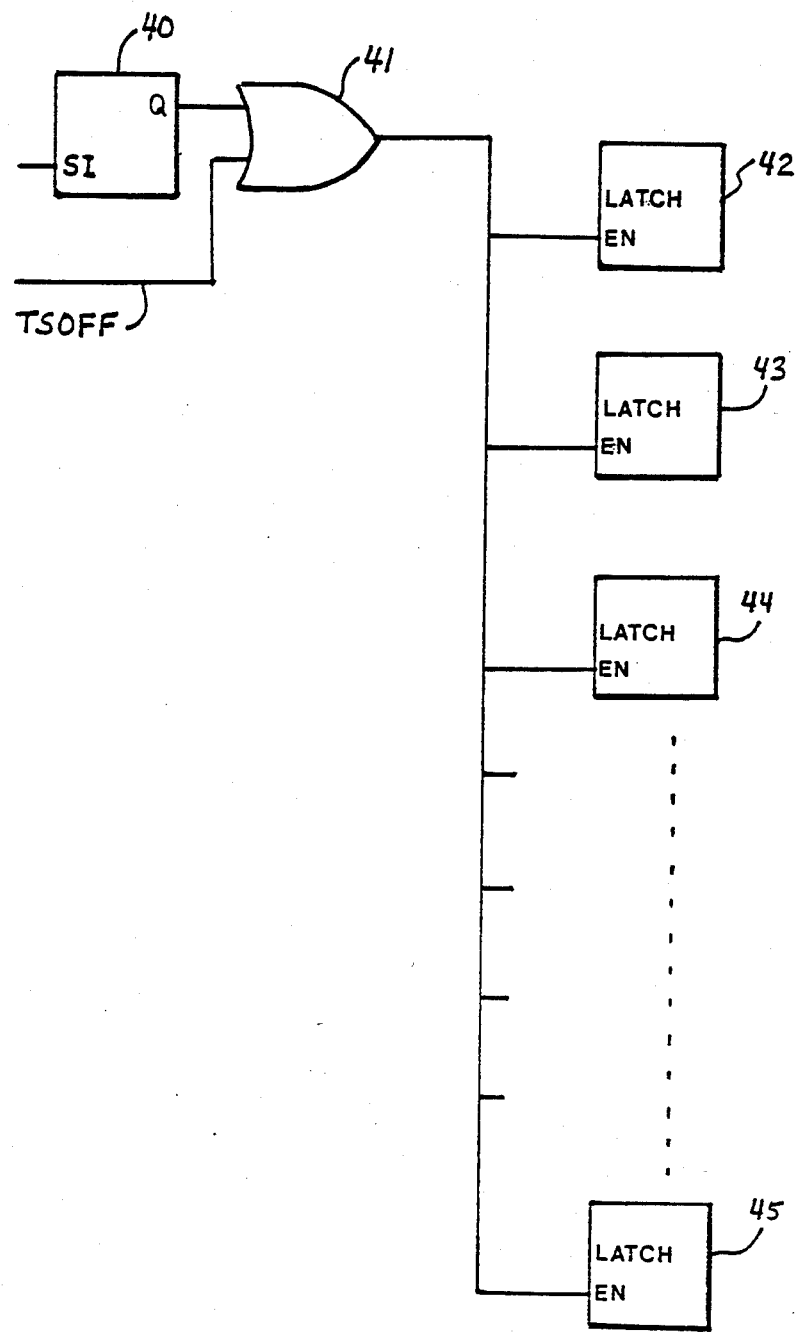
FIG. 4 is a logic drawing showing the circuit used to control the asynchronous/synchronous operaton of the latch circuit of the present invention.

FIG. 4 is a simplified logic diagram showing how the asynchronous or synchronous operation of the circuit of FIG. 3a may be controlled when used on a CMOS chip of the preferred embodiment. A plurality of latches 42-45 are shown as blocks. Each block represents the scannable asynchronous/synchronous latch of FIG. 3a; and in their totality, the blocks 42-45 represent all such latches on the CMOS chip. Only the EN input is shown for simplicity. All EN inputs are connected together so that all of the latches 42-45 are simultaneously operating in the synchronous mode or in the asynchronous mode.

The output of an OR gate 41 controls the level of the signal EN. The inputs of the OR gate 41 are the signals TSOFF (tri-state off) and the output of a latch 40. If either input is high, the signal EN will be high and the latches 42-45 will be in the synchronous mode of operation.

The latch 40 is a synchronous latch of the type shown in FIG. 2. Other embodiments may exist where the latch circuit 40 is only the shift register stage 16-17 of FIG 2.

In the preferred embodiment, it is desirable to have all the output circuits of the chip be tri-state drivers. (Tri-state drivers are well understood by those skilled in the art.) The signal TSOFF is used, among other things, to control the tri-state drivers. When the signal TSOFF is true, all the tri-state drivers will be turned off and no signals will leave the chip.

It is also desirable in the preferred embodiment to have all latches on the chip be scannable. This means that the shift register stages of the latches 42-45, the latch 40, and all the synchronous latches of the chip (not shown in the figure) need to be connected as part of a shift register. There may be more than one shift register on a chip so all the latches 42-45 are not necessarily part of the same shift register.

When the computer which uses the chips of the preferred embodiment is initially started, one of the steps of the startup procedure is to shift known values into all the latches of the system, via the shift registers. The latch 40 is also part of a shift register. Every time a low level signal is shifted through its shift register stage the output of the latch 40 will go low. If this output directly controlled the EN signal, the latches 42-45 would be converted to asynchronous latches and the shift register of which they are a part would be rendered inoperative. Advantageously, the OR gate 41 and signal TSOFF are used to overcome this defect. While this initial set of values is being shifted into all the latches, the computer is not operating and the output drivers are not needed. Therefore, during this shifting operation, TSOFF is held high. The output of the OR gate 41 is thus high and all the latches 42-45 are held in the synchronous mode of operation. The final value shifted into the latch 40 is a low level and when TSOFF is made low to allow operation to start, the low output of the latch 40, through the OR gate 41, will hold all the latches 42-45 in the asynchronous mode of operation.

As described above and in the aforecited '952 patent application, the use of scannable latches advantageously allows the computer to be stopped and the contents of the latches to be scanned for checking and/or reloaded with known values. The signal TSOFF is always held high during a scan operation, whether it be scan in or scan out, to hold the latches 42-45 in the synchronous mode of operation.

While the invention herein disclosed has been described by means of specific embodiments and applications thereof, numerous modifications and variations could be made thereto by those skilled in the art without departing from the spirit and scope of the present invention. It is therefore to be understood that within the scope of the claims, the invention may be practiced otherwise than as specifically described herein.

What is claimed is:

1. A scannable latch circuit comprising:
   first latch means, operable in a first mode of operation, for providing and maintaining a first data bit output signal at a first level in response to a specified change in a data bit input signal applied to an input terminal of said scannable latch circuit, said first data bit output signal being connected to a first output terminal;
   reset means, also operable in said first mode of operation, for resetting said first data bit output signal to a second level in response to a reset signal applied to a reset terminal of said scannable latch circuit;
   second latch means, operable in a second mode of operation for providing and maintaining a second data bit output signal connected to a second output terminal, and having a level that is equivalent to the level of said data bit input signal immediately prior to the occurrence of a specified transition in a first clock signal applied to a clock terminal of said scannable latch circuit, said second latch means maintaining the level of the second data bit output signal for the entire duration of a cycle of said first clock signal;
   shift means, operable in a third mode of operation, for selectively allowing data bit signals to be shifted into or out of said second latch means, said shift means including output means for shifting said data bit signals out of second latch means that is separate from said first and second data bit output signals provided by said first and second modes of operation, respectively; and
   select means for selecting the mode of operation of said scannable latch circuit, and for controlling the operation thereof.

2. The scannable latch of claim 1 wherein said first latch means comprises an asynchronous latch circuit comprising;
   an AND gate having a plurality of inputs and one output, one of said inputs being coupled to the reset terminal of said scannable latch circuit;
   a NOR gate having at least two inputs, one of its inputs being coupled to the output of the AND gate and the other of its inputs being coupled to the input terminal of said scannable latch circuit and having an output connected to said first output terminal of said scannable latch circuit; and
   a first inverter gate having a single input and a single output, the input of the inverter gate being coupled to an output of the NOR gate, and the output of the inverter gate being coupled to one of the inputs of the AND gate.

3. The scannable latch circuit of claim 2 wherein said asynchronous latch circuit further includes a second inverter gate having an input connected to the output of the NOR gate, and an output connected to a third output terminal of said scannable latch circuit.

4. The scannable latch circuit of claim 2 wherein said first inverter gate comprises an element of said second latch means, the input of said first inverter gate being coupled to the output of the NOR gate through a plurality of logic elements of said second latch means, the output of said first inverter gate being further coupled to a second output terminal of said scannable latch circuit, said second data bit output signal being provided on said second output terminal.

5. The scannable latch circuit of claim 1 wherein said second latch means comprises a first latch circuit connected serially to a second latch circuit, said first and second latch circuits operating respectively as master and slave latch circuits during said second mode of operation.

6. The scannable latch circuit of claim 5 wherein output means of said shift means comprises a third latch circuit coupled to said second latch circuit, said second and third latch circuits operating respectively as master and slave latch circuits during said third mode of operation.

7. The scannable latch circuit of claim 6 further including means for passing the first data bit output signal of said first latch means through said second latch means, whereby data held in said first latch means may be transferred to said second latch means and shifted thereoutof through the output means of said shift means during said third mode of operation.

8. The scannable latch circuit of claim 5 wherein said first latch circuit is responsive to a second clock signal and said second latch circuit is responsive to a third clock signal, said second and third clock signals being derived from said first clock signal by logic elements included within said select means.

9. The scannable latch circuit of claim 8 wherein said select means comprises:
   first logic means for dividing said first clock signal into said second and third clock signals; and
   second logic means responsive to an enable signal for blocking said second and third clock signals during said first mode of operation and for allowing said second and third clock signals to be respectively delivered to said first and second latch circuits during said second mode of operation.

10. A scannable synchronous/asynchronous CMOS latch circuit comprising:
    a first latch circuit for latching a first output signal to a first level in response to a prescribed change in a data input signal applied to a first input terminal thereof, said first output signal being connected to a first output terminal and for latching the first output signal to a second level in response to the application of a reset signal applied to a reset terminal thereof, said latching characterized by occurring without reference to any clocking signals;
    a second latch circuit connected to receive said data input signal from said first latch circuit and to latch a second output signal to a signal equivalent to the level of said data input signal immediately prior to the occurrence of a specified transition in a first clock signal applied to a clock terminal of said scannable synchronous/asynchronous CMOS latch circuit, and to maintain the latch level of said second output signal for the entire duration of cycle of said first clock signal said second output signal being connected to a second output terminal;
    scanning means for selectively shifting data held in said second latch circuit to a third output terminal;
    input means for selectively shifting data applied to a second input terminal of said scannable synchronous/asynchronous CMOS latch circuit directly into said second latch circuit; and select means, responsive to control signals including said first clock signal, for generating control and clock signals to selectively control the operation of said scannable synchronous/asynchronous CMOS latch circuit.

11. A LSI CMOS circuit chip comprising a plurality of scannable CMOS latch circuits, each scannable CMOS latch circuit comprising:

a first latch circuit for latching a first output signal to a first level in response to a prescribed change in a data input signal applied to a first input terminal thereof, said first output signal being connected to a first output terminal, and for latching the first output signal to a second level in response to the application of a reset signal applied to a reset terminal thereof, said latching characterized by occurring without reference to any clocking signals;

a second latch circuit connected to receive said data input signal from said first latch circuit and to latch a second output signal to a signal equivalent to the level of said data input signal immediately prior to the occurrence of a specified transition in a first clock signal applied to a clock terminal of said scannable synchronous/asynchronous CMOS latch circuit, and to maintain the latched level of sad second output signal for the entire duration of a cycle of said first clock signal said second output signal being connected to a second output terminal;

scanning means for selectively shifting data held in said second latch circuit to a third output terminal;

input means for selectively shifting data applied to a second input terminal of said scannable synchronous/asynchronous CMOS latch circuit directly into said second latch circuit; and select means, responsive to control signals including said first clock signal, for generating control clock signals to selectively control the operation of said scannable synchronous/asynchronous CMOS latch circuit;

means for interconnecting the select means of each of said scannable CMOS latch circuits so that all operate in a same mode of operation in response to a first prescribed control signal applied to a control terminal of said chip.

12. The LSI CMOS circuit chip of claim 11 wherein the scannable CMOS latch circuits operate in one of at least two modes of operation in response to said first prescribed control signal, a first mode of operation wherein the first latch circuit is operable, and a second mode of operation wherein the second latch circuit is operable.

13. The LSI CMOS circuit chip of claim 12 wherein the scannable CMOS latch circuits further operate in a third mode of operation in response to a second control signal applied to an additional control terminal of said chip, said third mode of operation being adapted to enable the scanning and input means of said scannable CMOS latch circuits.

* * * * *